(12) United States Patent
Kain

(10) Patent No.: US 10,236,765 B2
(45) Date of Patent: Mar. 19, 2019

(54) SWITCHED-CAPACITOR CIRCUIT AND METHOD OF OPERATING A SWITCHED-CAPACITOR CIRCUIT

(71) Applicant: Infineon Technologies AG, Neubiberg (DE)

(72) Inventor: Clemens Kain, Kammern (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/420,915

(22) Filed: Jan. 31, 2017

(65) Prior Publication Data

US 2018/0219476 A1   Aug. 2, 2018

(51) Int. Cl.

| | | |
|---|---|---|
| *H02M 3/07* | (2006.01) | |
| *G01R 15/14* | (2006.01) | |
| *G01R 15/16* | (2006.01) | |
| *G01R 19/00* | (2006.01) | |
| *H03F 3/45* | (2006.01) | |
| *H03K 17/687* | (2006.01) | |
| *H02M 3/156* | (2006.01) | |
| *H02M 1/00* | (2006.01) | |

(52) U.S. Cl.
CPC ............ *H02M 3/07* (2013.01); *G01R 15/146* (2013.01); *G01R 15/16* (2013.01); *G01R 19/0092* (2013.01); *H03F 3/45264* (2013.01); *H03K 17/6872* (2013.01); *H02M 3/156* (2013.01); *H02M 2001/0009* (2013.01); *H03F 2203/45544* (2013.01); *H03K 2217/0027* (2013.01)

(58) Field of Classification Search
CPC .. H02M 2/07; H02M 2/073; H02M 2003/075; H03K 17/693; H03K 19/01714; H03K 19/01735; G01R 15/16; H03F 2203/45551; H03F 2203/45544
See application file for complete search history.

(56) References Cited

U.S. PATENT DOCUMENTS 6,084,440 A * 7/2000 Sousa .................. G11C 27/024
  327/94
6,329,848 B1 * 12/2001 Maes ................... G11C 27/024
  327/534

(Continued)

*Primary Examiner* — Thomas J. Hiltunen
(74) *Attorney, Agent, or Firm* — Shumaker & Sieffert, P.A.

(57) ABSTRACT

A switched-capacitor circuit is described herein. In accordance with one exemplary embodiment the switched-capacitor circuit includes a first input node and a second input node and an input switch unit. The input switch is connected to the first input node and the second input node and has a first output node and a second output node. A first capacitor is coupled to the first output node of the input switch unit, and a second capacitor is coupled to the second output node of the input switch unit. The input switch unit includes a plurality of switches configured to con-nect and disconnect one of the first and second input nodes and one of the first capacitor and the second capacitor. The input switch unit further includes a first charge pump coupled to the first input node and a second charge pump coupled to the second input node. The first charge pump is configured to generate, based on a clock signal, switching signals for a switch of the plurality of switches, and the second charge pump is configured to generate, based on the clock signal, switching signals for a further switch of the plurality of switches.

25 Claims, 6 Drawing Sheets

(56) References Cited

U.S. PATENT DOCUMENTS

| | | | | |
|---|---|---|---|---|
| 6,404,237 | B1 * | 6/2002 | Mathew | H03K 17/063 |
| | | | | 326/106 |
| 6,731,155 | B2 * | 5/2004 | Hakkarainen | H03M 1/165 |
| | | | | 327/390 |
| 6,956,411 | B1 * | 10/2005 | Holloway | G11C 27/02 |
| | | | | 327/384 |
| 7,304,530 | B2 * | 12/2007 | Wei | H02M 3/073 |
| | | | | 327/390 |
| 7,969,336 | B2 * | 6/2011 | Yoshioka | G11C 27/02 |
| | | | | 327/91 |
| 8,076,966 | B2 * | 12/2011 | Hosoda | H03K 17/063 |
| | | | | 327/390 |
| 8,115,518 | B1 * | 2/2012 | Ali | G11C 27/02 |
| | | | | 327/390 |
| 8,890,577 | B1 * | 11/2014 | Trampitsch | H03K 5/2481 |
| | | | | 327/94 |
| 8,963,630 | B2 * | 2/2015 | Ceballos | H03F 3/45475 |
| | | | | 327/337 |
| 9,218,513 | B2 * | 12/2015 | Winiecki | G06G 7/12 |
| 10,020,069 | B2 * | 7/2018 | Huang | G11C 27/026 |
| 2005/0057283 | A1 * | 3/2005 | Ranganathan | G11C 27/02 |
| | | | | 327/94 |
| 2012/0194141 | A1 * | 8/2012 | Shi | H02M 3/157 |
| | | | | 320/137 |
| 2016/0100116 | A1 * | 4/2016 | Mesgarini | H04N 5/3745 |
| | | | | 348/300 |

* cited by examiner

SWITCHED-CAPACITOR CIRCUIT AND METHOD OF OPERATING A SWITCHED-CAPACITOR CIRCUIT

TECHNICAL FIELD

The disclosure relates to the field of switched-capacitor (SC) circuits, in particular to a SC circuit that may be used in a switched-capacitor amplifier for amplifying a current sense signal provided by a shunt resistor.

BACKGROUND

Load current measurement is crucial in many applications such as torque control with electric motors, the control of brushless DC motors or similar applications. As other inductive loads, electric motors are often driven by one or more transistor half-bridges. Two half-bridges may be connected to form an H-bridge three half-bridges may be connected to form a three-phase transistor bridge to drive the three phases of a three-phase electric motor. The half-bridges are usually driven in accordance with a pulse-width modulated control signal. However, other modulation schemes may be applicable instead of pulse-width modulation (PWM).

A direct load current measurement at the inductive load (e.g. by connecting a shunt resistor in series to the load) is often avoided as the resulting current sense signal is subject to rather high and abrupt variations of the common mode (CM) voltage. To avoid such high CM variations, current sensing is often done at the low-side switch of a transistor half-bridge. Such an arrangement, however, allows only for a current measurement while the low side switch is on. As a consequence, the current sense signal is discontinuous, which is undesired in some applications. When sensing the current directly at the load, the current sense signal is continuous. However, the mentioned CM variations cause undesired voltage spikes (due to parasitic inductances), which may have a negative impact on the achievable accuracy. Although the spikes can be reduced using filters, the mentioned CM variations remain an issue. Thus, there is a need for a current sense circuit with a high CM rejection.

SUMMARY

A switched-capacitor circuit is described herein. In accordance with one exemplary embodiment, the switched-capacitor circuit includes a first input node and a second input node and an input switch unit. The input switch is connected to the first input node and the second input node and has a first output node and a second output node. A first capacitor is coupled to the first output node of the input switch unit, and a second capacitor is coupled to the second output node of the input switch unit. The input switch unit includes a plurality of switches configured to connect and disconnect one of the first and second input nodes and one of the first and the second capacitors. The input switch unit further includes a first charge pump coupled to the first input node and a second charge pump coupled to the second input node. The first charge pump is configured to generate, based on a clock signal, switching signals for a switch of the plurality of switches, and the second charge pump is configured to generate, based on the clock signal, switching signals for a further switch of the plurality of switches.

Furthermore, a method of operating a switched-capacitor circuit is described herein, which includes an input switch unit coupling a first input node and a second input node of the switched-capacitor circuit with a first capacitor and a second capacitor of the switched-capacitor circuit. In accordance with one exemplary embodiment, the method includes connecting and disconnecting the first input node and the first capacitor using a first switch of the input switch unit as well as connecting and disconnecting the first input node and the second capacitor using a second switch of the input switch unit. Further, the method includes connecting and disconnecting the second input node and the first capacitor using a third switch of the input switch unit as well as connecting and disconnecting the second input node and the second capacitor using a fourth switch of the input switch unit. Moreover, the method includes generating, based on a clock signal, switching signals for the first and second switches using a first charge pump coupled to the first input node, and generating, based on the clock signal, switching signals for the third and fourth switches using a second charge pump coupled to the second input node.

Moreover, a current sense circuit is described herein. In accordance with one exemplary embodiment, the current sense amplifier includes an amplifier circuit, which has a first input node and a second input node, a shunt resistor, which is coupled to a load and the first and second input nodes of the amplifier circuit. The amplifier circuit is configured to amplify a voltage signal between the first and second input nodes resulting from a load current passing the shunt resistor. Furthermore, the amplifier circuit further includes a clock generator configured to generate a first switching signal and a second switching signal in accordance with a clock signal, a differential amplifier, which has a first differential input and a second differential input, and an input switch unit that is connected to the first input node and the second input node of the amplifier circuit and has a first output node and a second output node. The input switch unit is configured to connect, based on the first and second switching signals, either the first input node to the first output node and the second input node to the second output node or the first input node to the second output node and the second input node to the first output node. A first input capacitor is coupled between the first output node of the input switch unit and the first differential input of the differential amplifier, and a second input capacitor is coupled between the second output node of the input switch unit and the second differential input of the differential amplifier. An analog-to-digital converter is configured to generate a digital current sense value representing the amplified voltage signal.

Furthermore, an integrated circuit for driving a load, which is operably coupled to an output node of a transistor half-bridge, is described herein. In accordance with one exemplary embodiment, the circuit includes a driver circuit configured to switch a high-side switch and a low-side switch of the transistor half-bridge on and off in accordance with a modulated control signal. The circuit further includes a first input pin and a second input pin respectively coupled to a first terminal and a second terminal of a shunt resistor. The shunt resistor is operably coupled in series to the load. A clock generator is configured to generate a first switching signal and a second switching signal in accordance with a clock signal. A differential amplifier is configured to amplify a voltage signal between the first and second input pins resulting from a load current passing the shunt resistor. An input switch unit is connected to the first input pin and the second input pin and has a first output node and a second output node. The input switch unit is configured to connect, based on the first and second switching signals, either the first input pin to the first out-put node and the second input pin to the second output node or the first input pin to the second output node and the second input pin to the first output node. A first input capacitor is coupled between the first output node of the input switch unit and a first differential input of the differential amplifier, and a second input capacitor coupled between the second output node of the input switch unit and a second differential input of the differential amplifier.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

The exemplary embodiments described herein relate to a load driver circuit that includes a current sense circuit for generating a current feedback signal. In these examples, the load driver circuit generates drive signals for transistor half-bridges in accordance with a modulated (e.g. pulse-width modulated) control signal. The load may he one phase of an electric motor. It is noted, however, that the current sensing concept used in the examples described herein is not limited to current sensing at inductive loads such as electric motors but can also be utilized in other applications.

Figure 1:
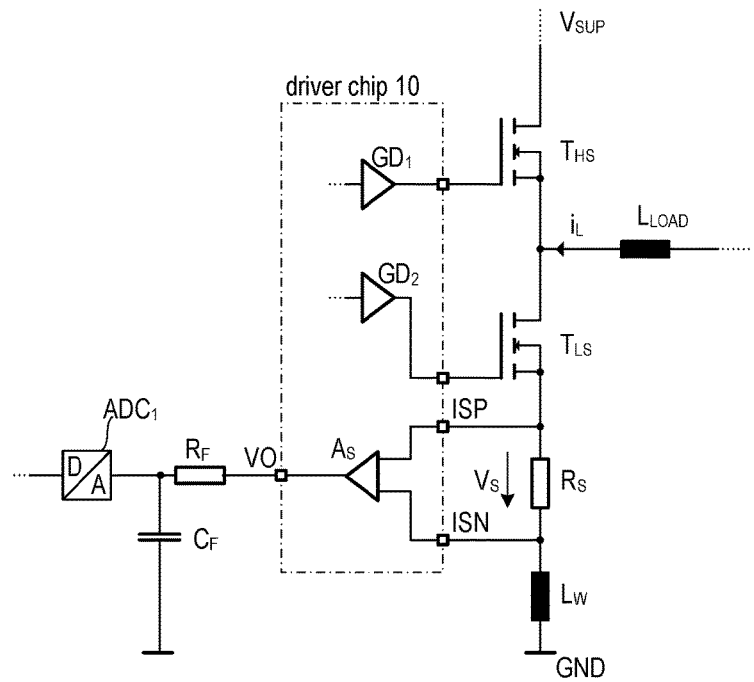
FIG. 1 is one example of a driver circuit for driving a transistor half-bridge, to which an inductive load (e.g. a phase of an electric motor) is connected, in accordance with a pulse-width modulated control signal.

FIG. 1 is one example of a driver circuit for driving a transistor half-bridge, which is composed of a low-side transistor $T_{LS}$ and a high-side transistor In the present example, the driver circuit may be at least partly included in a driver chip 10. The common circuit node, to which low-side transistor $T_{LS}$ and high-side transistor $T_{HS}$ are connected, is the output node of the half-bridge. The output node is connected to (e.g. inductive) load $L_{LOAD}$, for providing load current IL thereto in accordance with a pulse-width modulated control signal. The driver chip 10 includes a current sense circuit $A_S$ that amplifies a voltage signal $V_S$ tapped at a shunt resistor $R_S$ that is connected to the low-side transistor $R_S$ of the half-bridge. As can be seen in FIG. 1, the low-side transistor $T_{LS}$ and the shunt resistor $R_S$ are connected in series between the half-bridge output node and a ground node (which is at a reference potential such as ground potential). The inductance $L_W$ connected in series between the shunt resistor $R_S$ and ground represents parasitic line inductance. The high-side transistor $T_{HS}$ of the half-bridge is connected between the half-bridge output node and a supply terminal, at which supply voltage $V_{SUP}$ is provided.

The current measurement circuit may be at least partly integrated in a driver chip 10, which may include amongst other circuitry, gate driver circuits $GD_1$ and $GD_2$ and the mentioned current sense circuit (current sense amplifier $A_S$). As shown in the example of FIG. 1, a filter LPF may be connected to the output of the current sense amplifier $A_S$; the filter LPF may be a low-pass filter that is represented by a simple RC filter composed of a resistor $R_F$ and a capacitor $C_F$. However, a more complex filter may be used in other examples. The filtered output signal of the current sense amplifier $A_S$ may be supplied to an analog-to-digital converter $ADC_1$ for generating a digital current sense signal.

Due to the position of the shunt resistor $R_S$ in the low-side current path of the transistor half-bridge, the current sense signal, i.e. the voltage $V_S$ tapped at the sense resistor $R_S$, is discontinuous. That is, the current sense signal $V_S$ represents the load current ($V_S = R_S \cdot i_L$) only during time periods, in which the low-side transistor $T_{LS}$ is switched on, and is zero otherwise (i.e. when the low-side transistor $T_{LS}$ is off). In other words, the current sense signal is a discontinuous signal. Usually, the transistors $T_{HS}$ and $T_{LS}$ are subsequently switched on and off in a mutually exclusive manner. That is, transistor $T_{HS}$ is on while transistor $T_{LS}$ is off and vice versa. Further, the transistors $T_{HS}$ and $T_{LS}$ are switched in accordance with a modulated control signal. In case of PWM, the modulated control signal is a binary signal having a defined frequency and duty cycle. It is noted that half bridge switching in accordance with a modulated control signal is known as such and thus not further discussed herein.

Figure 2:
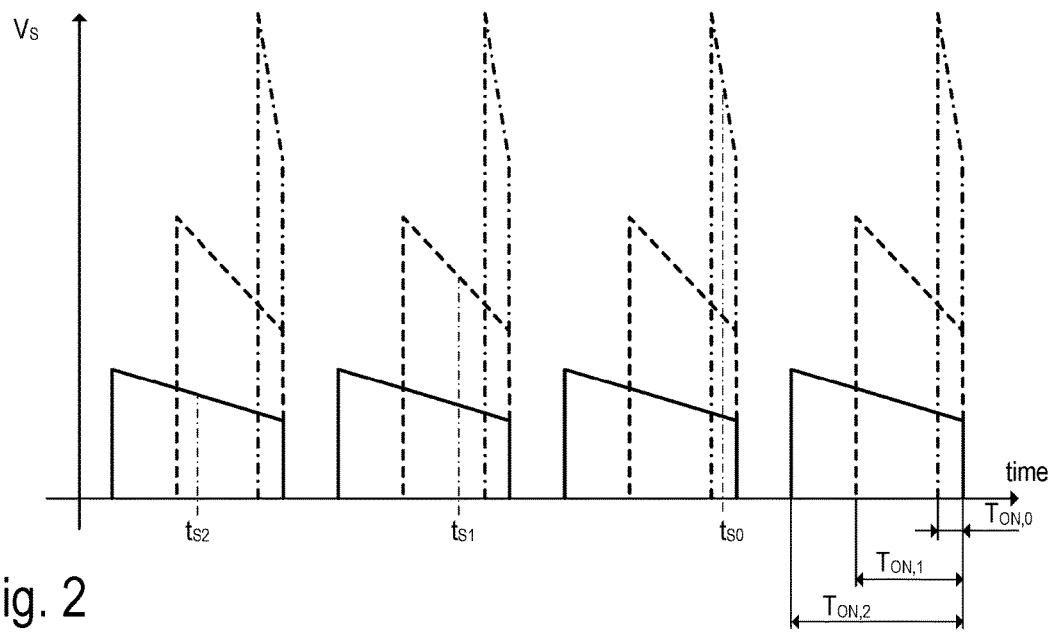
FIG. 2 illustrates exemplary waveforms illustrating the voltage signal tapped at the shunt resistor in FIG. 1 for different duty cycles of the pulse-width modulated control signal.

The diagram of FIG. 2 shows three exemplary waveforms illustrating the current sense signal $V_S$ (voltage signal) tapped at the shunt resistor $R_S$ in FIG. 1 for different duty cycles of the pulse-width modulated control signal. The on-time periods of the low side transistor $T_{LS}$ are denoted as $T_{ON,0}$ (short on-time, high duty cycle), $T_{ON,1}$ (medium on-time, medium duty cycle), and $T_{ON,2}$ (long on-time, small duty cycle). As the current sense signal $V_S$ is zero while the low-side transistor is off, the current information is included in subsequent pulses which become shorter as the duty cycle of the pulse-width modulated control signal increases. As those pulses may become rather short for high duty cycles, the time constant (and thus the settling time) of the mentioned low-pass filter should also be rather short, e.g. $T_{ON,0}/2$, wherein $T_{ON,0}$ is the on-time period of the low-side transistor for the maximum duty cycle. The time instants $t_{S0}$, $t_{S1}$, and $t_{S2}$ denote the desired sampling times, at which the analog-to-digital converter $ADC_1$ samples the analog current sense signal $V_S$ (after filtering). It is noted that a shorter time-constant of the filter LPF entails more residual noise in the filter output signal. In the present example, the common voltage $(V_{ISP}+V_{ISN})/2$ varies between zero (ground potential) and supply voltage of the half bridge.

Figure 3:
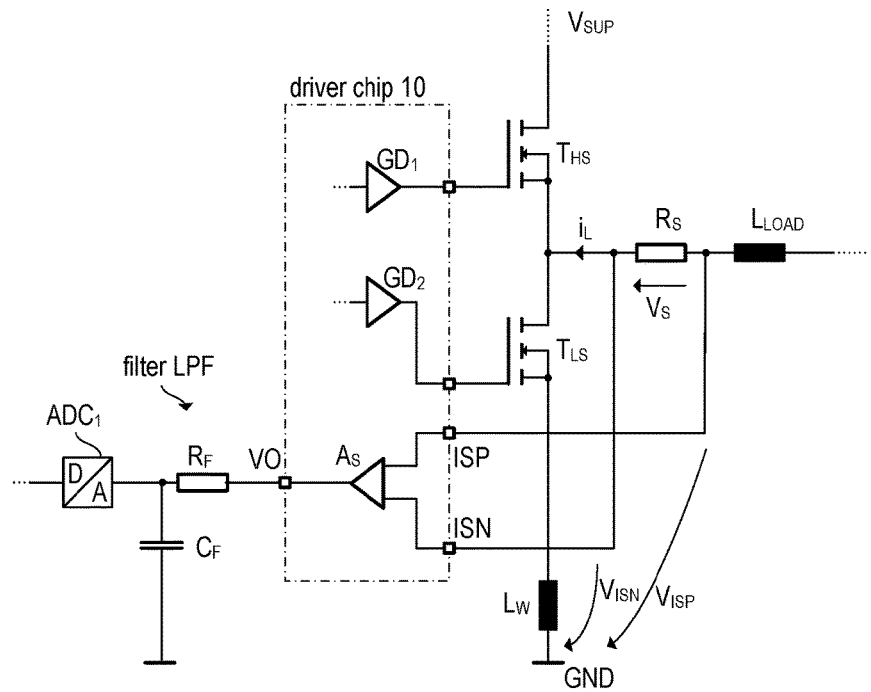
FIG. 3 is another example of a driver circuit for driving a transistor half-bridge in accordance with a pulse-width modulated control signal.
Figure 4:
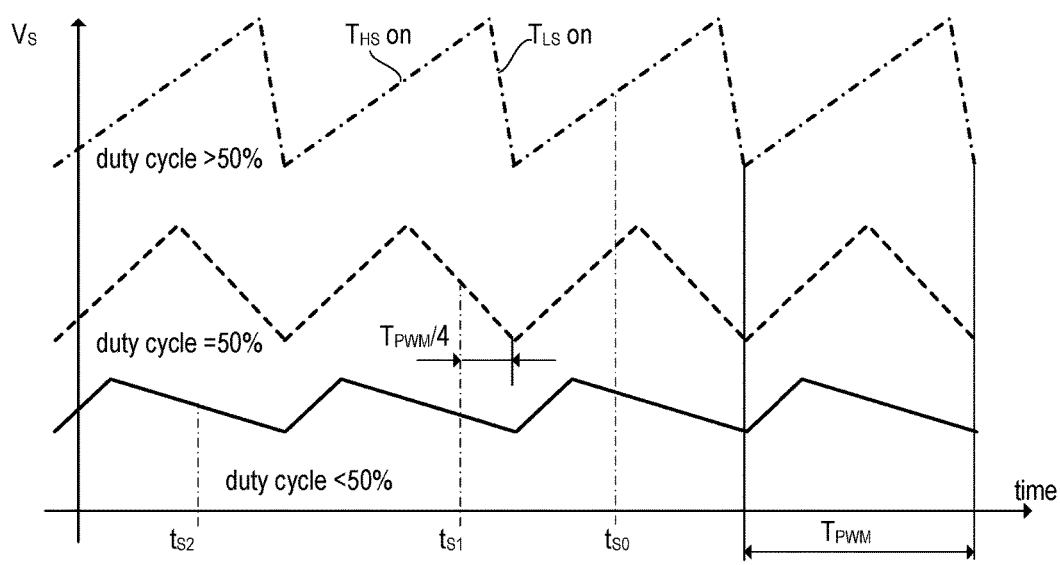
FIG. 4 illustrates exemplary waveforms illustrating the voltage signal tapped at the shunt resistor in FIG. 1 for different duty cycles of the pulse width modulation.

FIG. 3 illustrates an alternative example, in which the shunt resistor $R_S$ is connected in series to the load $L_{LOAD}$ at the output of the transistor half-bridge and not in the low-side current path of the half-bridge. As a consequence, the current sense signal $V_S$ (voltage signal) tapped at the shunt resistor represents the load current IL in both cases, when the low-side transistor $T_{LS}$ is on (while the high-side transistor $T_{HS}$ is off) as well as when the high-side transistor $T_{HS}$ is on (while the low-side transistor $T_{LS}$ is off). Apart from the position of the shunt resistor $R_S$, the example in FIG. 3 is the same as the previous example of FIG. 1 and reference is made to the respective description above. The diagram of FIG. 4 shows three exemplary waveforms illustrating the current sense signal $V_S$ (voltage signal) tapped at the shunt resistor $R_S$ in FIG. 1 for different duty cycles of the pulse-width modulated control signal. In contrast to the waveforms shown in FIG. 2, the waveforms in FIG. 4 illustrate the continuous current sense signal $V_S$, which is representative throughout the whole switching period $T_{PWM}$. Again, the time instants $t_{S0}$, $t_{S1}$, and $t_{S2}$ denote the desired sampling times, at which the analog-to-digital converter $ADC_1$ samples the analog current sense signal $V_S$ (after filtering). As can be seen from FIG. 4, the current signal can be sampled at the falling edge (as in the example of FIG. 2) for duty cycles lower than or equal to 50 percent. However, for duty cycles greater than 50 percent the current signal can be sampled at the rising edge, which is not possible in the example of FIG. 2). Accordingly, the minimum duration of a rising or falling edge, at which the current signal is sampled, is a quarter of the period of the PWM signal, i.e. $T_{PWM}/4$. Thus, the filter time constant, and thus the settling time, of the low-pass filter LPF may be longer as in the previous case, and the residual noise can be reduced.

The current sense amplifier $A_S$ is a differential amplifier and thus essentially amplifies the voltage difference $V_S = V_{ISP} - V_{ISN}$, wherein $V_{ISP}$ and $V_{ISN}$ are the voltages (with respect to ground) present at the input pins ISP and ISN of the driver chip 10 connected to the inputs of the current sense amplifier $A_S$. However, commonly known implementations of differential amplifiers exhibit a significant sensitivity to variations of the common mode (CM) voltage $V_{CM}$, which is defined as $V_{ISP} + V_{ISN}/2$. As the common mode variations are relatively high in the circuit configuration of FIG. 3, the finite CM rejection capability of common current sense amplifier $A_S$ may deteriorate the accuracy of the current measurement.

Figure 5:
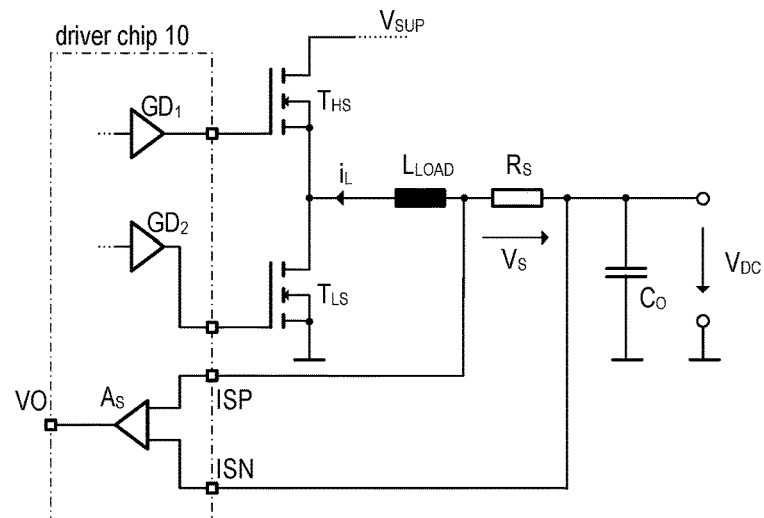
FIG. 5 is another exemplary application of a driver circuit for driving a transistor half-bridge of a buck converter.

The transistor half bridge in the example of FIG. 3 may be used to drive a phase of an electric motor. The half-bridge may be part of a H-bridge or a three-phase bridge (e.g. to drive a three-phase electric motor). FIG. 5 illustrates a different application, in which the half-bridge is part of a switching converter (buck converter). Accordingly, an inductor $L_{LOAD}$ is connected to the output node of the half-bridge (transistors $T_{HS}$ and $T_{LS}$). A shunt resistor $R_S$ is connected in series to the inductor $L_{LOAD}$ and connects the inductor $L_{LOAD}$ with an output terminal of the buck converter. A buffer capacitor $C_O$ is coupled between the output terminal and ground. The output voltage at the output terminal is labelled $V_{DC}$. In the present example, the CM voltage (voltage $(V_{ISP} + V_{ISN})/2$) is approximately equal to the output voltage $V_{DC}$.

Figure 6:
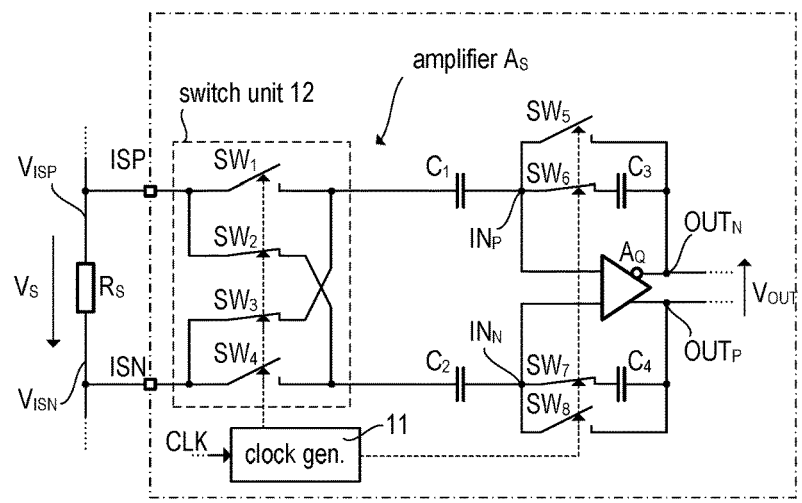
FIG. 6 illustrates one exemplary embodiment of a SC circuit included in a switched-capacitor amplifier for amplifying the voltage signal tapped at the shunt resistor of FIG. 3.

FIG. 6 illustrates one exemplary implementation of a current sense amplifier circuit $A_S$ that may be integrated in the driver chip 10 (see FIG. 3). In the present example, the amplifier $A_S$ utilizes a switching capacitor scheme, which allows for a high CM rejection. Thus, the amplifier $A_S$ of FIG. 6 is suitable for applications, in which the shunt resistor is coupled to an output of a transistor bridge (see FIG. 3), which leads to high CM variations as discussed further above. $A_S$ the amplifier $A_S$ shown in FIG. 6 is a differential amplifier configured to amplify the voltage difference $V_S = V_{ISP} - V_{ISN}$, the amplifier $A_S$ has two input nodes, wherein a first input node is connected to the ISP pin and a second input node is connected to the ISN pin. The amplifier $A_S$ includes an input switch unit 12 including (inter alia) four electronic switches $SW_1$, $SW_2$, $SW_3$, and $SW_4$. The input switch unit 12 is configured to couple the input nodes (and thus the input pins ISP and ISN) alternatingly to a first input capacitor $C_1$ and a second input capacitor $C_2$. In other words, in a first switching state, pin ISP is connected to capacitor $C_1$ while pin ISN is connected to capacitor $C_2$, and, in a second switching state, pin ISP is connected to capacitor $C_2$ while pin ISN is connected to capacitor $C_1$. In order to implement such a switching scheme, switches $SW_1$ and $SW_2$ are switched on and off synchronously in accordance with a clock signal CLK. Analogously, switches $SW_2$ and $SW_3$ are switched on and off synchronously in accordance with a clock signal CLK, wherein switches $SW_1$ and $SW_2$ (as well as switches $SW_3$ and $SW_4$) are switched in a mutually exclusive manner (i.e. $SW_1$ is on while $SW_2$ is off and vice versa), The input capacitors $C_1$ and $C_2$ are connected to the input nodes $IN_P$ and $IN_N$ of a differential amplifier $A_Q$, so that the first input capacitor $C_1$ is connected between amplifier input node $IN_P$ and, dependent on the switch positions, either the ISP pin or the ISN pin. Analogously, the second input capacitor $C_2$ is connected between amplifier input node $IN_N$ and, dependent on the switch positions, either the ISN pin or the ISP pin. The differential amplifier $A_Q$ has two feedback paths, a first feedback path from the amplifier output node $OUT_N$ to amplifier input node $IN_P$, and a second feedback path from the amplifier output node $OUT_P$ to amplifier input node $IN_N$. The first feedback path includes a series circuit of feedback capacitor $C_3$ (feedback capacitor) and an electronic switch $SW_6$, wherein the whole feedback path may be short-circuited by closing electronic switch $SW_5$. Analogously, the second feedback path includes a series circuit of feedback capacitor $C_4$ (feedback capacitor) and an electronic switch $SW_7$, wherein the whole feedback path may be short-circuited by closing electronic switch $SW_8$. In the present example, switches $SW_5$ and $SW_8$ are switched on and off substantially simultaneously with switches $SW_1$ and $SW_4$, while switches $SW_6$ and $SW_7$ are switched on and off substantially simultaneously with switches $SW_2$ and $SW_3$. The gain factor of the current sense amplifier circuit $A_S$ is determined by the ratio $C_3/C_1 = C_4/C_2$ of the capacitances of the feedback capacitors and the input capacitors. The differential output voltage $V_{OUT}$ is provided between the amplifier output nodes $OUT_P$ and $OUT_N$ and may be converted (before or after sampling) into a single-ended output voltage by another amplifier stage (not shown). Accordingly, the sense current amplifier $A_S$ may include a sample-and-hold circuit and an output amplifier coupled in series to the switched-capacitor amplifier downstream thereof. The switching operation of switched capacitor amplifiers is as such known and not discussed in further detail herein. In the present example, the switching signals for the electronic switches $SW_1$ to $SW_8$ is generated by clock generator 11 based on a (master) clock signal CLK.

In the example of FIG. 6, the CM voltage is blocked by input capacitors $C_1$ and $C_2$, which may be high-voltage (HV) capacitors dependent on the semiconductor technology uses for fabricating the driver chip 10. In this regard, I-IV means that the maximum voltage applied across the capacitors $C_1$ and $C_2$ may be in the range of the CM voltage at the input pins ISP and ISN, and the CM voltage may be as high as the maximum voltage allowable for the used semiconductor technology (e.g. 60 volts). However, the input switch unit 12 including switches $SW_1$ to $SW_4$ may be composed of low-voltage (LV) switches, and the switches ($SW_5$ to $SW_8$) in the feedback paths may also be LV switches. In this context LV means a voltage that is substantially lower than the maximum CM voltage specified for a specific application (e.g. lower than half of the CM voltage).

Figure 7:
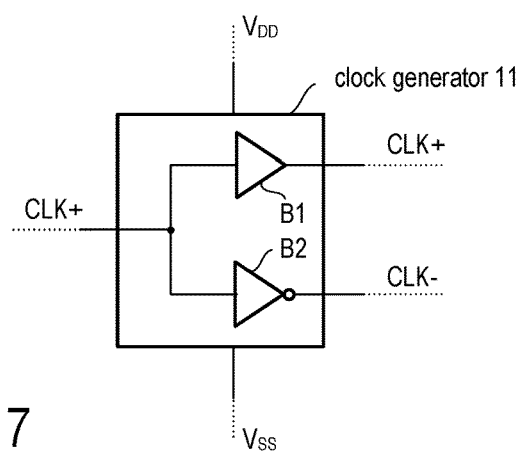
FIG. 7 illustrates one exemplary clock generator circuit that may be used in the SC circuit of FIG. 6.

FIG. 7 illustrates one exemplary implementation of the clock generator circuit 11. Accordingly, the clock generator circuit 11 includes a non-inverting buffer B1 and an inverting buffer B2. An input clock signal CLK may be supplied to both, the non-inverting buffer B1 and the inverting buffer B2. The switching signal CLK+ is provided by buffer B1 while the inverse switching signal CLK− is provided by buffer B2. Both signals CLK+ and CLK− are binary signals which are either at the supply voltage $V_{DD}$ (e.g. 1.5 V) or the reference voltage Vss (ground).

Figure 8:
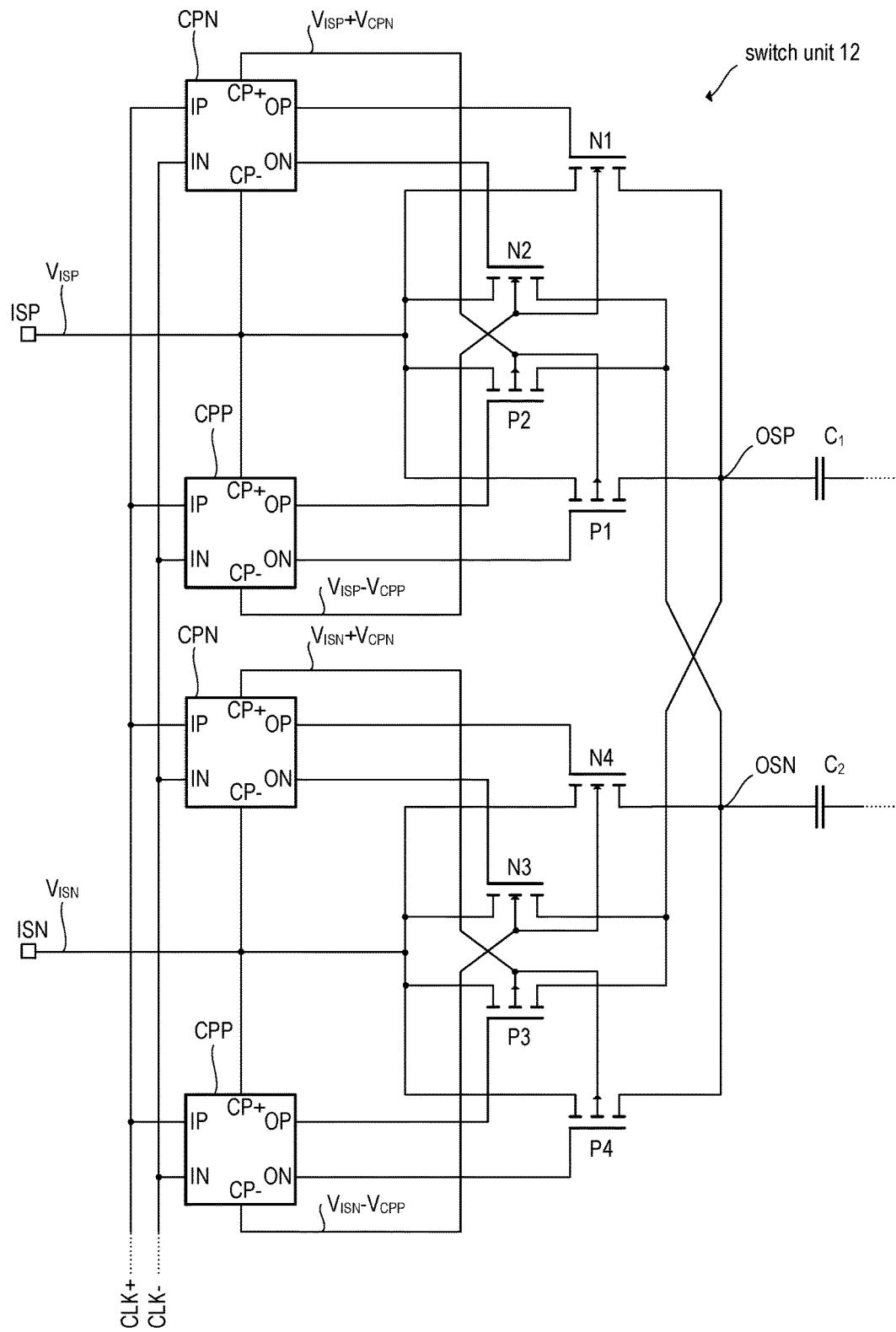
FIG. 8 illustrates one more detailed example of the SC circuit of FIG. 6.

The electronic switches $SW_1$ to $SW_4$ of the input switch unit 12 may be implemented using transmission gates (T-gates) which are composed of a p-channel MOS (PMOS) transistor and an n-channel MOS (NMOS) transistor connected in parallel. However, if only one supply voltage $V_{DD}$ is available, the biasing of the bulk terminals of the PMOS and NMOS transistors as well as the level-shifting of the switching signals CLK+ and CLK− cannot be accomplished in a straightforward manner. FIG. 8 illustrates one exemplary embodiment of the input switch unit 12 used in the current sense amplifier circuit $A_S$ of FIG. 6. In the example of FIG. 8, the electronic switch $SW_1$ (see FIG. 6) is implemented by a transmission gate composed of NMOS transistor N1 and PMOS transistor P1, the electronic switch $SW_2$ (see FIG. 6) is implemented by a transmission gate composed of NMOS transistor N2 and PMOS transistor P2, the electronic switch $SW_3$ (see FIG. 6) is implemented by a transmission gate composed of NMOS transistor N3 and PMOS transistor P3, and, finally, the electronic switch $SW_4$ (see FIG. 6) is implemented by a transmission gate composed of NMOS transistor N4 and PMOS transistor P4. The function of a transmission gate is as such known and not further explained here.

To ensure proper reverse biasing of the intrinsic bulk diodes of the transistors, the bulk terminals of the PMOS transistors P1 and P2 are biased with a bias voltage $V_{ISP}+V_{CPN}$ while the bulk terminals of the NMOS transistors Ni and N2 are biased with a bias voltage $V_{ISP}-V_{CPP}$. That is, the bias voltage of the bulk terminals of the PMOS transistors P1 and P2 is (by a value $V_{CPN}$) above the input voltage $V_{ISP}$ received at the ISP pin, and the bias voltage of the bulk terminals of the NMOS transistors N1 and N2 is (by a value $V_{CPN}$) below the input voltage $V_{ISP}$ received at the ISP pin. The bulk terminals of the PMOS transistors P3 and P4 and the bulk terminals of the NMOS transistor N3 and N4 are biased in a similar manner with the bias voltages $V_{ISN}+V_{CPN}$ and $V_{ISN}-V_{CPP}$, respectively. It is noted that the bias voltages "seen" by the transistors N1 to N4 and P1 to P4 are $V_{CPN}$ (for the PMOS transostors P1 to P4) and, respectively, $V_{CPP}$ (for the NMOS transistors N1 to N4). That is, the bias voltages $V_{CPN}$ and $V_{CPP}$ are floating and the charge pumps CPN and CNP use the electric potentials (i.e. the voltages $V_{ISN}$ and $V_{ISP}$ with respect to ground) at the ISN and ISP pins, respectively, as (floating) reference potential.

In the present example, the bias voltages $V_{ISP}+V_{CPN}$ and $V_{ISN}+V_{CPN}$ are generated by the two charge-pumps labelled CPN, while the bias voltages $V_{ISP}-V_{CPP}$ and $V_{ISN}-V_{CPN}$ are generated by the two charge-pumps labelled CPP. Generally, the charge-pumps CPN and CPP may be regarded as voltage sources, which provide a voltage VCPN or, respectively, $V_{CPP}$ between the charge-pump output terminals CP− and CP+. Accordingly, a voltage $V_{ISP}-V_{CPN}$ may be tapped at terminal CP+ when the terminal CP− of charge-pump CPN is connected to the ISP terminal. Similarly, the a voltage $V_{ISP}-V_{CPP}$ may be tapped at terminal CP− when the terminal CP+ of charge-pump CPP is connected to the ISP terminal. The same is valid for the charge-pumps that are connected to the ISN terminal to provide voltages $V_{ISN}+V_{CPN}$ and $V_{ISN}-V_{CPP}$. The gate voltages applied to the gate terminals of the NMOS transistors N1 to N4 are also provided by the charge-pumps CPN at their OP and ON terminals as shown in FIG. 8. Similarly, the gate voltages applied to the gate terminals of the PMOS transistors P1 to P4 are provided by the charge-pumps CPP at their OP and ON terminals (see FIG. 8). All chary pumps CPN and CPP receive the switching signals CLK+ and CLK− (see FIG. 7) at their IP and IN terminals. As mentioned above, the input switch unit 12 has two inputs connected to the ISP and ISN pins. The output nodes of the input switch unit are labelled OSP and OSN and are connected to the capacitors $C_1$ and $C_2$ as also shown in the example of FIG. 6. It is noted that the floating switching signals (gate signals) generated by the charge pumps CPN (and provided at their OP and ON terminals) are non-negative with respect to the potentials $V_{ISP}$ and $V_{ISN}$ of the ISP and ISN pins, respectively. That is, the floating switching signals "seen" by the NMOS transistors are either at zero volts or at $V_{CPN}$. Analogously, the floating switching signals (gate signals) generated by the charge pumps CPP (and provided at their OP and ON terminals) are non-positive with respect to the potentials $V_{ISP}$ and $V_{ISN}$ of the ISP and ISN pins, respectively. That is, the floating switching signals "seen" by the PMOS transistors are either at zero volts or at $-V_{CPP}$.

Figure 9:
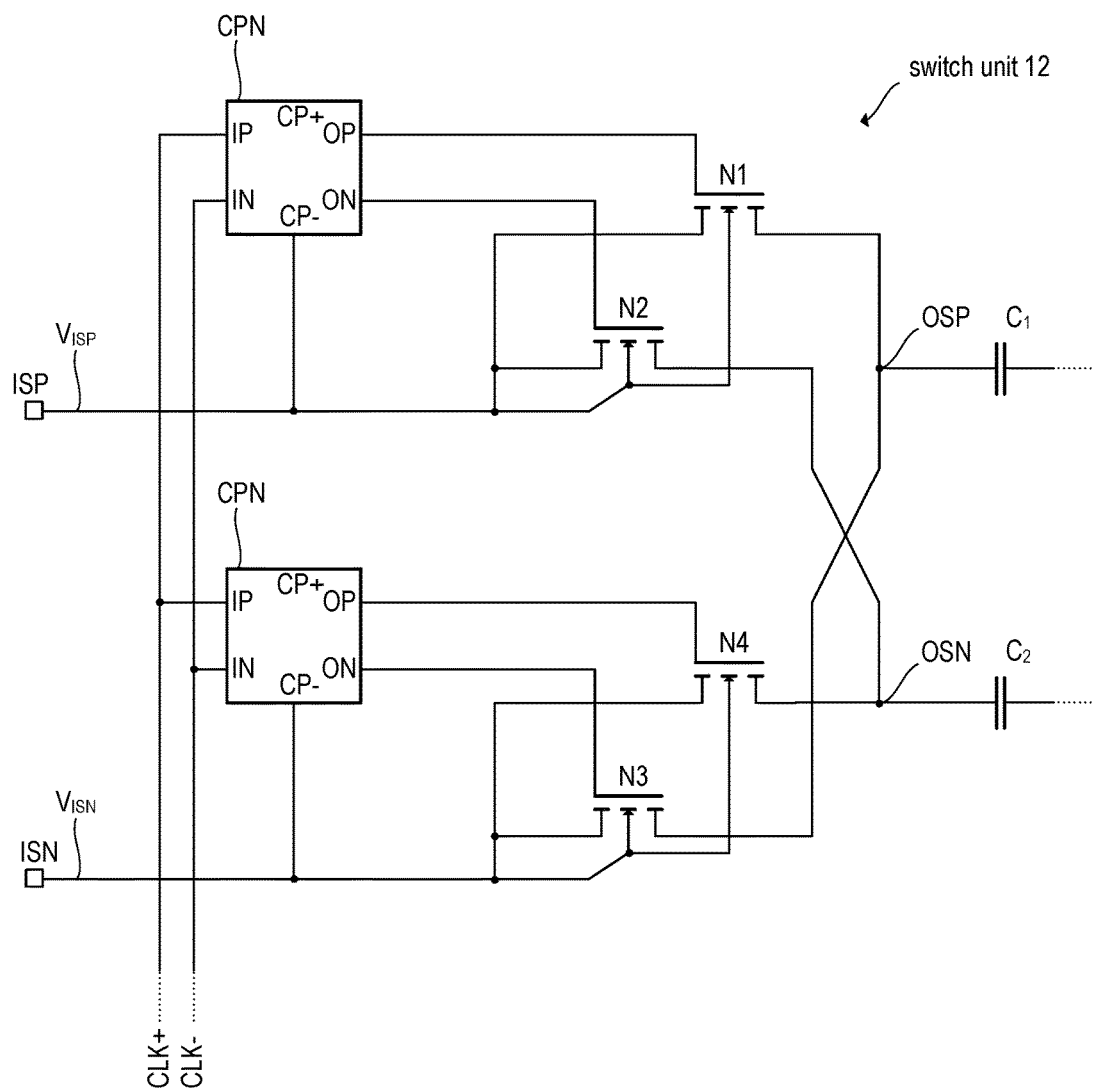
FIG. 9 illustrates another less complex example of the SC circuit of FIG. 6

In one alternative embodiment, the transmission gates (combinations of an NMOS and a PMOS transistor) may be replaced by a single NMOS transistor or a single MPOS transistor, which may be sufficient in applications with low CM variations. In other words, starting with the example of FIG. 8, either the NMOS transistors N1, N2, N3, and N4 or the PNOS transistors P1, P2, P3, and P4 may be omitted. The respective charge-pumps CPN or, respectively, CPP may then be omitted as well. One example, in which the PMOS transistors P1 to P4 as well as the respective charge pumps CPP have been omitted, is depicted in FIG. 9. One can see in FIG. 9 that, in contrast to the previous example, the bulk terminals of the NMOS transistors N1 to N4 are connected with the respective source terminals of the transistors. As charge pumps CPP, which would provide a (floating) negative bias voltage with respect to the electric potential of the ISP and ISN pins, are not available in the present example, the source and drain terminals of each NMOS transistor is coupled to the same circuit node (ISP pin or ISN pin) and thus the bias voltage is zero.

Figure 10:
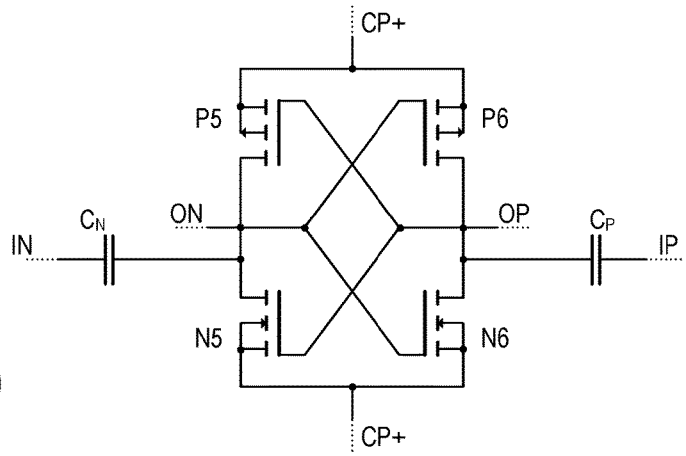
FIG. 10 illustrates one example of a charge pump circuit used in the example of FIG. 8 or 9.

One exemplary implementation of the charge pumps CPP and CPN is described below with reference to FIG. 10. The charge pumps CPP and CPN may be identical. However, the charge pumps CPP and CPN differ in their use as can be seen from FIG. 8. The charge pumps CPN are connected to the reference potential (e.g. at the ISP or ISN pin) with their CP− terminal and provide a (floating) higher voltage at their CP+ terminal. Conversely, the charge pumps CPP are connected to the reference potential (e.g. at the ISP or ISN pin) with their CP+ terminal and provide a (floating) lower voltage at their CP− terminal. According to the present example, the charge pumps CPN and CPP may be implemented as charge pumps that include a latch and the pump capacitors $C_P$ and $C_N$ connected between the terminals IN and ON and, respectively, IP and OP. The clock signals CLIC+ and CLK− are received at the terminals IP and IN (see FIG. 8), and the (floating) gate voltages for the transmission gates are provided at the terminals OP and ON (see FIG. 8, transistors N1 to N4 and P1 to P4). In each charge pump, NMOS transistors N5 and N6 are connected between the terminal CP− of the charge pump and the terminals ON and, respectively, OP, while the PMOS transistors P5 and P6 are connected between the terminal CP+ of the charge pump and the terminals ON and, respectively, OP. To form a latch, the gate terminals of transistors P5 and N5 are connected to the terminal OP, while the gate terminals of transistors P6 and N6 are connected to the terminal ON of the charge pump.

Figure 11:
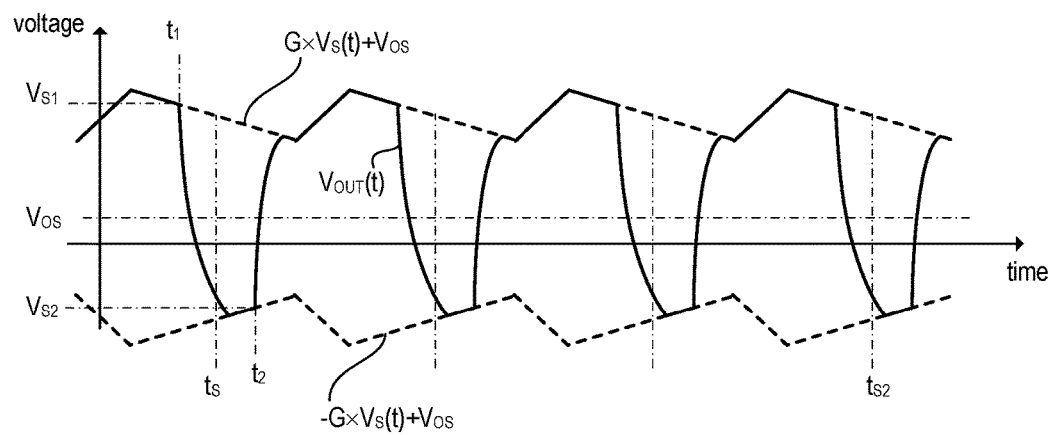
FIG. 11 is a diagram illustrating the waveform of the output of the switched-capacitor amplifier when using gain-inversion f©r offset compensation.

The switched-capacitor amplifier circuit $A_S$ of FIG. 6 may be used for offset compensation. A gain inversion from gain G to gain −G may easily be accomplished by inverting the clock signals CLK+ and CLK− (see FIGS. 7 and 8). FIG. 11 is a diagram illustrating the waveform of the switched-capacitor amplifier output $V_{OUT}$ when using gain-inversion for offset compensation as well as the waveform of the input voltage $V_S$ (tapped at the sense resistor $R_S$) and the inverted input voltage $-V_S$. To obtain a measurement of the load current, the input voltage may be sam-pled at time instant ts, which is exactly in the middle of the on-time period of the low-side switch $T_{LS}$ (see FIG. 3). According to the present example, the amplifier output voltage $V_{OUT}=G \cdot V_S$ is sampled at time instant ti, which is bit earlier than the time instant $t_S$; subsequently the amplifier gain is inverted and the inverted amplifier output voltage $V_{OUT}=-G \cdot V_S$ is sampled at time instant $t_2$; subsequently, the gain is inverted again. The theoretic value of the voltage $G \cdot V_S(t_S)$ at the time instant ts can be calculated as $$G \cdot V_S(t_S)=(V_{OUT}(t_1)-V_{OUT}(t_2))/2=(G \cdot V_S(t_1)-(-G)\cdot V_S(t_2))/2, \quad (1)$$

wherein an offset $V_{OS}$ that may be included in the output voltage VOUT cancels out. The difference between the time instants $t_1$ and is is the same as the difference between the time instants $t_S$ and $t_2$ ($t_S-t_1=t_2-t_S$).

Exemplary embodiments are summarized below. It is, however, emphasized that the following is not an exhaustive enumeration of examples but rather an exemplary summary. The various features of the embodiments may be combined in any way unless explicitly stated otherwise. A first example relates to a switched-capacitor circuit. Accordingly, the switched-capacitor circuit includes a first input node and a second input node as well as an input switch unit. The input switch unit is connected to the first input node and the second input node and has a first output node and a second output node. A first capacitor is coupled to the first output node of the input switch unit, and a second capacitor is coupled to the second output node of the input switch unit. The input switch unit includes a plurality of switches configured to connect and disconnect one of the first and second input nodes and one of the first capacitor and the second capacitor. The input switch unit further includes a first charge pump coupled to the first input node and a second charge pump coupled to the second input node. The first charge pump is configured to generate, based on a clock signal, switching signals for a switch of the plurality of switches, and the second charge pump is configured to generate, based on the clock signal, switching signals for a further switch of the plurality of switches (see, for example, FIGS. 6 and 9).

In any example, the switching signals generated by one of the charge-pumps may be floating signals. In other words, the first charge pump and the second charge pump may be configured to use an electric potential at the first input node and, respectively, the second input node as floating reference potentials to generate floating signals as the switching signals.

According to a second example the input switch unit may include four switches, wherein a first switch is coupled between the first input node and the first output node, a second switch is coupled between the first input node and the second output node, a third switch is coupled between the second input node and the first output node, and a fourth switch is coupled between the second input node and the second output node. In any example, the first switch and the second switch may be configured to be regularly switched on and off in a mutually exclusive manner, and the third and the fourth switch may also be configured to be regularly switched on and off in a mutually exclusive manner.

According to a third example the first switch is configured to connect and disconnect the first input node and the first output node based on a first one of the switching signals provided by the first charge pump, the second switch is configured to connect and disconnect the first input node and the second output node based on a second one of the switching signals provided by the first charge pump, the third switch is configured to connect and disconnect the second input node and the first output node based on a first one of the switching signals provided by the second charge pump, and the fourth switch is configured to connect and disconnect the second input node and the second output node based on a second one of the switching signals provided by the second charge pump. In any example, the plurality of switches of the input switch unit each may comprise a MOS transistor (see, for example, FIG. 9) or, alternatively, a transmission gate (see, for example, FIG. 8). The MOS transistors may receive the switching signals generated form the first charge pump or the second charge pump as gate signals.

According to a third example, the first switch, the second switch, the third switch, and the fourth switch each may comprise a p-channel MOS transistor and an n-channel MOS transistor forming the transmission gate, wherein the input switch unit may further comprise a third charge pump coupled to the first input node and at least a fourth charge pump coupled to the second input node. The first charge pump and the second charge pump may be configured to generate a positive floating bias voltage with respect to an electrical potential at the first input node and, respectively, the second input node, wherein the positive floating bias voltage may be supplied to bulk terminals of the p-channel MOS transistors of the first and the second switch as well as the third and the fourth switch. Analogously, the third charge pump and the fourth charge pump may be configured to generate a negative floating bias voltage with respect to an electrical potential at the first input node and, respectively, the second input node, wherein the negative floating bias voltage may be supplied to bulk terminals of the n-channel MOS transistors of the first and the second switch as well as the third and the fourth switch (see, for example, FIG. 8).

According to a fourth example, the first switch and the second switch each may comprise a MOS transistor, wherein the MOS transistor of the first switch and the MOS transistor of the second switch may each be configured to receive, as a gate signal, one of the switching signals provided by the first charge pump. Analogously, the third switch and the fourth switch may each comprise a MOS transistor, and the MOS transistor of the third switch and the MOS transistor of the fourth switch may each be configured to receive, as a gate signal, one of the switching signals provided by the second charge pump.

The switching signals generated by the first charge pump and the second charge pump may have only non-negative voltage values with respect to an electrical potential at the first input node and, respectively, the second input node. These switching signals may thus be supplied, as gate signals, to the n-channel MOS transistors of the first and the second switch and, respectively, the third and the fourth switch. Similarly, the third and the fourth charge pump may be configured to generate switching signals that have only non-positive voltage values with respect to an electrical potential at the first input node and, respectively, the second input node. These switching signals may be supplied, as gate signals, to the p-channel MOS transistors of the first and the second switch and, respectively, the third and the fourth switch.

In any example, a differential amplifier, which has a first amplifier input and a second amplifier input, may be coupled to the first capacitor (with the first amplifier input) and the second capacitor (with the second amplifier input). The differential amplifier may have a first amplifier output and a second amplifier output; the first amplifier output is coupled to the first amplifier input via a first feedback path, the second amplifier output is coupled to the second amplifier input via a second feedback path. The first feedback path may comprise a first feedback capacitor and the second feedback path comprises a second feedback capacitor. Further, the first feedback path may comprise a fifth switch connected in series to the first feedback capacitor, and a sixth switch may be configured to provide a short-circuit across the first feedback path. Similarly, the second feedback path may comprise a seventh switch connected in series to the second feedback capacitor, and an eighth switch may be configured to provide a short-circuit across the second feedback path.

In any example, a clock generator may be configured to generate, in accordance with the clock signal, a first switching signal and a second switching signal, which is an inverse of the first switching signal. The first and the second switching signals may be supplied to the first and the second charge pump.

Another example relates to a method of operating a switched-capacitor circuit, which includes an input switch unit coupling a first input node and a second input node of the switched-capacitor circuit with a first capacitor and a second capacitor of the switched-capacitor circuit. Accordingly, the method includes connecting and disconnecting the first input node and the first capacitor using a first switch of the input switch unit as well as connecting and disconnecting the first input node and the second capacitor using a second switch of the input switch unit. Further, the method includes connecting and disconnecting the second input node and the first capacitor using a third switch of the input switch unit as well as connecting and disconnecting the second input node and the second capacitor using a fourth switch of the input switch unit. Moreover, the method includes generating, based on a clock signal, switching signals for the first and second switches using a first charge pump coupled to the first input node, and generating, based on the clock signal, switching signals for the third and fourth switches using a second charge pump coupled to the second input node.

According to a further example, the first to the fourth switch may each include a MOS transistor, and thus the method may include supplying the switching signals generated by the first charge pump as gate signals to the MOS transistors of the first and the second switches, and supplying the switching signals generated by the second charge pump as gate signals to the MOS transistors of the third and the fourth switches.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

I claim:

1. A switched-capacitor circuit comprising:
a first input node and a second input node;
an input switch unit connected to the first input node and the second input node and having a first output node and a second output node;
a first capacitor coupled to the first output node of the input switch unit, and
a second capacitor coupled to the second output node of the input switch unit;
wherein the input switch unit comprises a plurality of switches configured to connect and disconnect one of the first and second input nodes and one of the first and second capacitors, the plurality of switches comprising:
a first switch coupled between the first input node and the first output node,
a second switch coupled between the first input node and the second output node,
a third switch coupled between the second input node and the first output node, and
a fourth switch coupled between the second input node and the second output node;
wherein the input switch unit further comprises a first charge pump coupled to the first input node and a second charge pump coupled to the second input node;
wherein the first charge pump is configured to generate, based on a clock signal, switching signals for the first switch, and the second charge pump is configured to generate, based on the clock signal, switching signals for the third switch;
wherein the first charge pump is configured to generate a first floating bias voltage with respect to an electric potential at the first input node and to supply the first floating bias voltage to a bulk terminal of the first switch; and wherein the second charge pump is configured to generate a second floating bias voltage with respect to an electric potential at the second input node and to supply the second floating bias voltage to a bulk terminal of the third switch.

2. The switched-capacitor circuit of claim 1, wherein the switching signals are floating.

3. The switched-capacitor circuit of claim 1, wherein the first charge pump and the second charge pump are configured to use the electric potential at the first input node and the second input node, respectively, as floating reference potentials to generate floating signals as the switching signals.

4. The switched-capacitor circuit of claim 1, wherein:
the first switch is configured to connect and disconnect the first input node and the first output node based on a first one of the switching signals provided by the first charge pump,
the second switch is configured to connect and disconnect the first input node and the second output node based on a second one of the switching signals provided by the first charge pump,
the third switch is configured to connect and disconnect the second input node and the first output node based on a first one of the switching signals provided by the second charge pump, and
the fourth switch is configured to connect and disconnect the second input node and the second output node based on a second one of the switching signals provided by the second charge pump.

5. The switched-capacitor circuit of claim 1,
wherein the first switch and the second switch are configured to be regularly switched on and off in a mutually exclusive manner; and
wherein the third switch and the fourth switch are configured to be regularly switched on and off in a mutually exclusive manner.

6. The switched-capacitor circuit of claim 1, wherein the plurality of switches of the input switch unit each comprise a MOS transistor, the MOS transistors being configured to receive the switching signals generated from the first charge pump or the second charge pump as gate signals.

7. The switched-capacitor circuit of claim 1,
wherein the first switch and the second switch each comprise a MOS transistor; and
wherein the MOS transistor of the first switch and the MOS transistor of the second switch are each configured to receive, as a gate signal, one of the switching signals provided by the first charge pump.

8. The switched-capacitor circuit of claim 1,
wherein the third switch and the fourth switch each comprise a MOS transistor; and
wherein the MOS transistor of the third switch and the MOS transistor of the fourth switch are each configured to receive, as a gate signal, one of the switching signals provided by the second charge pump.

9. The switched-capacitor circuit of claim 1, wherein the first switch, the second switch, the third switch, and the fourth switch each comprise a transmission gate comprising a p-channel MOS transistor and an n-channel MOS transistor.

10. The switched-capacitor circuit of claim 9, wherein the input switch unit further comprises a third charge pump coupled to the first input node and a fourth charge pump coupled to the second input node.

11. The switched-capacitor circuit of claim 9, wherein the first charge pump is configured to:
generate the first floating bias voltage at least in part by generating a first positive floating bias voltage with respect to the electric potential at the first input node; and
supply the first positive floating bias voltage to bulk terminals of the p-channel MOS transistors of the first switch and the second switch, and
wherein the second charge pump is configured to:
generate the second floating bias voltage at least in part by generating a second positive floating bias voltage with respect to the electric potential at the second input node; and
supply the second positive floating bias voltage to bulk terminals of the p-channel MOS transistors of the third switch and the fourth switch.

12. The switched-capacitor circuit of claim 10, wherein the third charge pump is configured to:
generate a first negative floating bias voltage with respect to the electric potential at the first input node; and
supply the first negative floating bias voltage to bulk terminals of the n-channel MOS transistors of the first switch and the second switch, and
wherein the fourth charge pump is configured to:
generate a second negative floating bias voltage with respect to the electric potential at the second input node; and
supply the second negative floating bias voltage to bulk terminals of the n-channel MOS transistors of the third switch and the fourth switch.

13. The switched-capacitor circuit of claim 9,
wherein the switching signals generated by the first charge pump and the second charge pump have only non-negative voltage values with respect to the electric potential at the first input node and the second input node, respectively; and
wherein the first charge pump and the second charge pump are configured to supply the switching signals generated by the first charge pump and the second charge pump as gate signals to the n-channel MOS transistors of the first and second switches and the third and fourth switches, respectively.

14. The switched-capacitor circuit of claim 10, wherein the third charge pump and the fourth charge pump are configured to:
generate floating switching signals that have only non-positive voltage values with respect to the electric potential at the first input node and the second input node, respectively; and
supply the floating switching signals generated by the third charge pump and the fourth charge pump as gate signals to the p-channel MOS transistors of the first and second switches and the third and fourth switches, respectively.

15. The switched-capacitor circuit of claim 1, further comprising a differential amplifier having a first amplifier input and a second amplifier input, the first amplifier input being coupled to the first capacitor and the second amplifier input being coupled to the second capacitor.

16. The switched-capacitor circuit of claim 15, wherein the differential amplifier has a first amplifier output and a second amplifier output, the first amplifier output being coupled to the first amplifier input via a first feedback path, the second amplifier output being coupled to the second amplifier input via a second feedback path.

17. The switched-capacitor circuit of claim 16, wherein the first feedback path comprises a first feedback capacitor and the second feedback path comprises a second feedback capacitor.

18. The switched-capacitor circuit of claim 17,
wherein the first feedback path comprises a fifth switch connected in series to the first feedback capacitor and a sixth switch configured to provide a short-circuit across the first feedback path; and
wherein the second feedback path comprises a seventh switch connected in series to the second feedback capacitor and an eighth switch configured to provide a short-circuit across the second feedback path.

19. The switched-capacitor circuit of claim 1, further comprising a clock generator configured to:
generate, in accordance with the clock signal, a first switching signal and a second switching signal, which is an inverse of the first switching signal; and
supply the first and second switching signals to the first and second charge pumps, respectively.

20. The switched-capacitor circuit of claim 1,
wherein the first floating bias voltage generated by the first charge pump is different from the electric potential at the first input node, and
wherein the second floating bias voltage generated by the second charge pump is different from the electric potential at the second input node.

21. A current sense circuit comprising:
an amplifier circuit having a first input node and a second input node; and
a shunt resistor coupled to a load and the first and second input nodes of the amplifier circuit,
wherein the amplifier circuit is configured to amplify a voltage signal between the first and second input nodes resulting from a load current passing the shunt resistor, and wherein the amplifier circuit further comprises:
a clock generator configured to generate a first switching signal and a second switching signal in accordance with a clock signal;
a differential amplifier having a first differential input and a second differential input;
an input switch unit connected to the first input node and the second input node of the amplifier circuit and having a first output node and a second output node, the input switch unit comprising a plurality of switches being configured to connect, based on the first and second switching signals, either the first input node to the first output node and the second input node to the second output node or the first input node to the second output node and the second input node to the first output node;
a first input capacitor coupled between the first output node of the input switch unit and the first differential input of the differential amplifier;
a second input capacitor coupled between the second output node of the input switch unit and the second differential input of the differential amplifier; and
an analog-to-digital converter configured to generate a digital current sense value representing the amplified voltage signal,
wherein the input switch unit further comprises a first charge pump coupled to the first input node and a second charge pump coupled to the second input node;
wherein the first charge pump is configured to generate a first floating bias voltage with respect to an electric potential at the first input node and to supply the first floating bias voltage to a bulk terminal of a first switch of the plurality of switches; and
wherein the second charge pump is configured to generate a second floating bias voltage with respect to an electric potential at the second input node and to supply the second floating bias voltage to a bulk terminal of a third switch of the plurality of switches.

22. The current sense circuit of claim 21,
wherein the first switch is coupled between the first input node and the first output node,
wherein the third switch is coupled between the second input node and the first output node,
wherein the plurality of switches further comprises:
a second switch coupled between the first input node and the second output node, and
a fourth switch coupled between the second input node and the second output node,
wherein the first charge pump is further configured to supply the first floating bias voltage to a bulk terminal of the second switch, and
wherein the second charge pump is further configured to supply the second floating bias voltage to a bulk terminal of the fourth switch.

23. An integrated circuit for driving a load operably coupled to an output node of a transistor half-bridge, the circuit comprising:
a driver circuit configured to switch a high-side switch and a low-side switch of the transistor half-bridge on and off in accordance with a modulated control signal;
a first input pin and a second input pin respectively coupled to a first terminal and a second terminal of a shunt resistor, which is operably coupled in series to the load;
a clock generator configured to generate a first switching signal and a second switching signal in accordance with a clock signal;
a differential amplifier configured to amplify a voltage signal between the first and second input pins resulting from a load current passing the shunt resistor;
an input switch unit connected to the first input pin and the second input pin and having a first output node and a second output node, the input switch unit comprising a plurality of switches configured to connect, based on the first and second switching signals, either the first input pin to the first output node and the second input pin to the second output node or the first input pin to the second output node and the second input pin to the first output node;
a first input capacitor coupled between the first output node of the input switch unit and a first differential input of the differential amplifier; and
a second input capacitor coupled between the second output node of the input switch unit and a second differential input of the differential amplifier,
wherein the input switch unit further comprises a first charge pump coupled to the first input node and a second charge pump coupled to the second input node;
wherein the first charge pump is configured to generate a first floating bias voltage with respect to an electric potential at the first input node and to supply the first floating bias voltage to a bulk terminal of a first switch of the plurality of switches; and
wherein the second charge pump is configured to generate a second floating bias voltage with respect to an electric potential at the second input node and to supply the second floating bias voltage to a bulk terminal of a third switch of the plurality of switches.

24. A method of operating a switched-capacitor circuit, the switched-capacitor circuit comprising an input switch unit coupling a first input node and a second input node of the switched-capacitor circuit with a first capacitor and a second capacitor of the switched-capacitor circuit, the method comprising:
- connecting and disconnecting the first input node and the first capacitor using a first switch of the input switch unit;
- connecting and disconnecting the first input node and the second capacitor using a second switch of the input switch unit;
- connecting and disconnecting the second input node and the first capacitor using a third switch of the input switch unit;
- connecting and disconnecting the second input node and the second capacitor using a fourth switch of the input switch unit;
- generating, based on a clock signal, switching signals for the first and second switches using a first charge pump coupled to the first input node;
- generating, based on the clock signal, switching signals for the third and fourth switches using a second charge pump coupled to the second input node;
- generating a first floating bias voltage with respect to an electric potential at the first input node, using the first charge pump;
- supplying the first floating bias voltage to a bulk terminal of the first switch and the second switch;
- generating a second floating bias voltage with respect to an electric potential at the second input node, using the second charge pump; and
- supplying the second floating bias voltage to a bulk terminal of the third switch and the fourth switch.

25. The method of claim 24, wherein the first switch, the second switch, the third switch, and the fourth switch each comprise at least one MOS transistor, the method further comprising:
- supplying the switching signals generated by the first charge pump as gate signals to the MOS transistors of the first and second switches; and
- supplying the switching signals generated by the second charge pump as gate signals to the MOS transistors of the third and fourth switches.

* * * * *